(12) United States Patent
Baek et al.

(10) Patent No.: US 9,310,421 B2
(45) Date of Patent: Apr. 12, 2016

(54) APPARATUS FOR TESTING THYRISTOR VALVE

(71) Applicants: LSIS CO., LTD., Anyang-si, Gyeonggi-do (KR); MYONGJI UNIVERSITY INDUSTRY AND ACADEMIA COOPERATION FOUNDATION, Yongin-si, Gyeonggi-do (KR)

(72) Inventors: Seung Taek Baek, Anyang-si (KR); Byung Moon Han, Seoul (KR); Eui Cheol Nho, Busan (KR); Yong Ho Chung, Ansan-si (KR); Wook Hwa Lee, Incheon (KR)

(73) Assignees: LSIS CO., LTD., Anyang-si, Gyeonggi-do (KR); Corporation Foundation, Yongin-si, Gyeonggi-do (KR)

( * ) Notice: Subject to any disclaimer, the term of this patent is extended or adjusted under 35 U.S.C. 154(b) by 351 days.

(21) Appl. No.: 13/890,059

(22) Filed: May 8, 2013

(65) Prior Publication Data

US 2013/0314111 A1 Nov. 28, 2013

(30) Foreign Application Priority Data

May 22, 2012 (KR) .................. 10-2012-0054159

(51) Int. Cl.
*G01R 31/26* (2014.01)
*G01R 31/333* (2006.01)
(Continued)

(52) U.S. Cl.
CPC .......... *G01R 31/263* (2013.01); *G01R 31/3336* (2013.01); *G01R 31/00* (2013.01); *G01R 31/31924* (2013.01); *G01R 31/40* (2013.01)

(58) Field of Classification Search
CPC .. G01R 31/00; G01R 31/31924; G01R 31/40; G01P 3/488; G01P 3/44

USPC ........................................... 324/176
See application file for complete search history.

(56) References Cited

U.S. PATENT DOCUMENTS 4,056,776 A * 11/1977 Olsson ................... G01R 31/40
                                                              324/537
4,133,018 A *  1/1979 Terunuma .............. G01R 29/18
                                                              340/645

(Continued)

FOREIGN PATENT DOCUMENTS

CN          1206960         2/1999
CN          1493004         4/2004

(Continued)

OTHER PUBLICATIONS

B.L. Sheng E. Jansson A. Blomberg H-0 Bjarme D. Windmar; A New Synthetic Test Circuit for the Operational Tests of HVDC Thyristor Modules; Applied Power Electronics Conference and Exposition, 2001. APEC 2001. Sixteenth Annual IEEE (vol. 2 ); Ludvika Sweden; pp. 1242-1246 vol. 2.*

(Continued)

*Primary Examiner* — Jermele M Hollington
*Assistant Examiner* — Christopher McAndrew
(74) *Attorney, Agent, or Firm* — Lee, Hong, Degerman, Kang & Waimey

(57) ABSTRACT

An apparatus for testing a thyristor valve includes: a current source circuit that provides an electric current when a thyristor valve as a test target is turned on; a voltage source circuit that provides a reverse voltage or a forward voltage when the thyristor valve is turned off; and a first auxiliary valve provided between a connection point between the thyristor valve and the voltage source circuit and the current source circuit, and that insulates the current source circuit from the voltage source circuit to protect the current source circuit from a high voltage of the voltage source circuit.

8 Claims, 5 Drawing Sheets

(51) Int. Cl.
  *G01R 31/319* (2006.01)
  *G01R 31/00* (2006.01)
  *G01R 31/40* (2014.01)

(56) References Cited

U.S. PATENT DOCUMENTS

| | | | | | |
|---|---|---|---|---|---|
| 4,161,023 | A | * | 7/1979 | Goffeau | H02M 3/1582 323/224 |
| 4,214,483 | A | * | 7/1980 | Young | G01P 3/484 324/160 |
| 4,355,364 | A | * | 10/1982 | Gudat | G01P 13/045 324/166 |
| 4,471,301 | A | * | 9/1984 | Durov | G01R 31/263 327/764.01 |
| 4,504,789 | A | * | 3/1985 | Carr | G01R 31/2827 324/418 |
| 4,607,311 | A | * | 8/1986 | Brown | H01F 7/1816 123/490 |
| 4,633,241 | A | * | 12/1986 | Casteel | G01R 31/263 324/762.01 |
| 4,672,315 | A | * | 6/1987 | Heinzler | H02M 1/092 324/762.01 |
| 4,675,800 | A | * | 6/1987 | Seki | H02M 1/088 327/441 |
| 4,685,045 | A | * | 8/1987 | Baraban | H03K 17/08144 340/645 |
| 4,715,009 | A | * | 12/1987 | Bohmler | G01P 3/489 324/176 |
| 4,745,513 | A | * | 5/1988 | McMurray | H02H 7/1225 361/104 |
| 4,884,025 | A | * | 11/1989 | Hausler | H02M 1/088 324/762.01 |
| 5,521,526 | A | * | 5/1996 | Nyberg | G01R 31/263 324/762.01 |
| 5,983,188 | A | * | 11/1999 | Roessle | B60K 31/047 701/300 |
| 6,791,852 | B2 | * | 9/2004 | Carter | H02H 7/1255 361/100 |
| 7,307,362 | B1 | * | 12/2007 | Yampolsky | H03K 3/021 307/108 |
| 7,940,016 | B2 | * | 5/2011 | Donnelly | B60L 7/04 318/139 |
| 8,138,771 | B2 | * | 3/2012 | Nurmi | G06F 3/045 324/176 |
| 8,339,151 | B2 | * | 12/2012 | He | G01R 31/3272 324/762.01 |
| 8,339,153 | B2 | * | 12/2012 | Zha | G01R 31/263 324/762.07 |
| 9,041,426 | B2 | * | 5/2015 | Tang | G01R 31/14 324/537 |
| 2006/0001388 | A1 | * | 1/2006 | Stork | H02P 23/03 318/66 |
| 2007/0254776 | A1 | * | 11/2007 | Wakashiro | B60K 6/48 477/181 |
| 2008/0238211 | A1 | * | 10/2008 | Yampolsky | H03K 3/021 307/108 |
| 2010/0219765 | A1 | * | 9/2010 | Toda | H05B 41/2885 315/224 |
| 2010/0244887 | A1 | * | 9/2010 | De Cock | H02P 8/38 324/765.01 |
| 2010/0303460 | A1 | * | 12/2010 | Hunter | G01D 5/24495 398/25 |
| 2011/0242855 | A1 | * | 10/2011 | Jovcic | H02M 3/07 363/17 |
| 2011/0273200 | A1 | * | 11/2011 | Zha | G01R 31/263 324/762.01 |
| 2011/0273201 | A1 | * | 11/2011 | He | G01R 31/3272 324/762.01 |
| 2011/0298448 | A1 | * | 12/2011 | Foletto | G01D 5/145 324/207.13 |
| 2011/0298449 | A1 | * | 12/2011 | Foletto | G01D 5/24452 324/207.13 |

FOREIGN PATENT DOCUMENTS

| | | |
|---|---|---|
| CN | 101452045 | 6/2009 |
| CN | 101776732 | 7/2010 |
| JP | 09-269354 | 10/1997 |
| JP | 2912004 | 6/1999 |

OTHER PUBLICATIONS

Korean Intellectual Property Office Application Serial No. 10-2012-0054159, Office Action dated Aug. 19, 2013, 4 pages.
The State Intellectual Property Office of the People's Republic of China Application Serial No. 201310192739.2, Office Action dated Mar. 27, 2015, 7 pages.
Sheng, et al., "A New Synthetic Test Circuit for the Operational Tests of HVDC Thyristor Modules," Applied Power Electronics Conference and Exposition, IEEE 2001, pp. 1242-1246.
Japan Patent Office Application Serial No. 2013-106240, Office Action dated May 13, 2014, 2 pages.
Xia, et al., "IGBT on Two-phase Direct Current Chopper Applications," China Academic Journal Electronics Publishing House, vol. 29, No. 11, Nov. 2009, pp. 40-42.
The State Intellectual Property Office of the People's Republic of China Application Serial No. 201310192739.2 Office Action dated Nov. 10, 2015, 8 pages.

* cited by examiner

APPARATUS FOR TESTING THYRISTOR VALVE

CROSS-REFERENCE TO RELATED APPLICATION

Pursuant to 35 U.S.C. §119(a), this application claims the benefit of earlier filing date and right of priority to Korean Application No. 10-2012-0054159, filed on May 22, 2012, the contents of which is incorporated by reference herein in its entirety.

BACKGROUND OF THE INVENTION

1. Field of the Invention

The present disclosure relates to an apparatus for testing a thyristor valve, and particularly, to an apparatus for testing a thyristor valve capable of testing a rated current and a rated voltage of a thyristor valve.

2. Background of the Invention

According to an electric power transmission of a high voltage direct current (HVDC), when alternating current (AC) electric power produced in a power plant is converted into a direct current (DC) electric power and transmitted, an electric power receiving equipment re-converts the DC into an AC and supply the converted AC electric power. The HVDC transmission is effective and economical in comparison to an AC transmission.

In an HVDC system, a thyristor valve is provided in a converter for converting an AC into a DC and an inverter for converting a DC into an AC. Since a high voltage and a large current is applied to the thyristor valve, excessive current stress and voltage stress may occur. Thus, it is required to artificially apply a voltage and a current having the same level as that applied to an actual HVDC system to an independent thyristor valve to test performance thereof in advance.

SUMMARY OF THE INVENTION

Therefore, an aspect of the detailed description is to provide an apparatus for testing a thyristor valve capable of easily testing both current stress and voltage stress of a thyristor valve by supplying a current by using a chopper circuit in case that the thyristor valve is turned on and by supplying a reverse voltage and a forward voltage by using a resonant circuit in case that the thyristor is turned off.

To achieve these and other advantages and in accordance with the purpose of this disclosure, as embodied and broadly described herein, an apparatus for testing a thyristor valve, the apparatus comprising:

a current source circuit that provides an electric current when a thyristor valve as a test target is turned on;

a voltage source circuit that provides a reverse voltage or a forward voltage when the thyristor valve is turned off; and a first auxiliary valve provided between a connection point between the thyristor valve and the voltage source circuit and the current source circuit, and that insulates the current source circuit from the voltage source circuit to protect the current source circuit from a high voltage of the voltage source circuit.

According to one aspect of this disclosure, the current source circuit comprises:

a first direct current (DC) source circuit section that changes a DC voltage and supply the DC voltage while controlling an increase rate of a current provided to the thyristor valve; and a chopper circuit that steps down an output voltage from the first DC source circuit section.

According to another aspect of this disclosure, the first DC source circuit section is configured by any one of a 6-pulses phase control rectifier, a 12-pulses phase control rectifier, and a 18-pulses phase control rectifier.

According to still another aspect of this disclosure, the chopper circuit comprises:

a first switch having one end connected to an anode output terminal of the first DC source circuit section;

a first diode provided between the first switch and a cathode output terminal of the first DC source circuit section;

a first inductor connected to a connection point between the first switch and the first diode; and a second switch provided between the first inductor and the first auxiliary valve.

According to another aspect of this disclosure, the chopper circuit is configured by a single-phase chopper circuit, or a multi-phases chopper circuit.

According to still another aspect of this disclosure, the first switch and the second switch are configured by any one of an IGBT (Insulated Gate Bipolar Ttransistor) and an IGCT (Integrated Gate-Commutated Thyristor), respectively.

According to still another aspect of this disclosure, the apparatus for testing a thyristor valve further comprising:

an auxiliary circuit that forcibly turns off the first auxiliary valve when the thyristor valve is turned off.

According to still another aspect of this disclosure, the auxiliary circuit comprises:

a second DC source circuit section that generates a DC voltage for turning off the first auxiliary valve;

an auxiliary switch having one end connected to an anode output terminal of the second DC source circuit section and the other end connected to the current source circuit; and a capacitor having one end connected to the auxiliary switch and the other end connected to a connection point between the current source circuit and the first auxiliary valve.

According to still another aspect of this disclosure, the second DC source circuit section is configured by any one of a 6-pulses diode rectifier, a 12-pulses diode rectifier, and a 18-pulses diode rectifier that converts an AC voltage into a DC voltage.

According to still another aspect of this disclosure, the auxiliary switch is an IGBT (Insulated gate bipolar transistor) or an IGCT (Integrated Gate-Commutated Thyristor).

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this disclosure, illustrate exemplary embodiments and together with the description serve to explain the principles of the invention.

In the drawings:

FIGS. 2A to 2I are circuit diagrams illustrating an equivalent circuit diagram according to each operation mode in the apparatus for testing a thyristor valve according to a preferred embodiment of the present disclosure, wherein FIGS. 2A to 2D are equivalent circuit diagrams illustrating an equivalent circuit according to each operation mode in case that a test current is applied to a thyristor valve as a test target when the thyristor valve is in an ON state;

FIGS. 2E to 2G are equivalent circuit diagrams illustrating an equivalent circuit according to each operation mode in case that a reverse voltage is applied to a thyristor valve as a test target when the thyristor valve is in an OFF state; and FIGS. 2H to 2I are equivalent circuit diagrams illustrating an equivalent circuit according to each operation mode in case that a forward voltage is applied to a thyristor valve as a test target when the thyristor valve is in an OFF state.

DETAILED DESCRIPTION OF THE INVENTION

Figure 1:
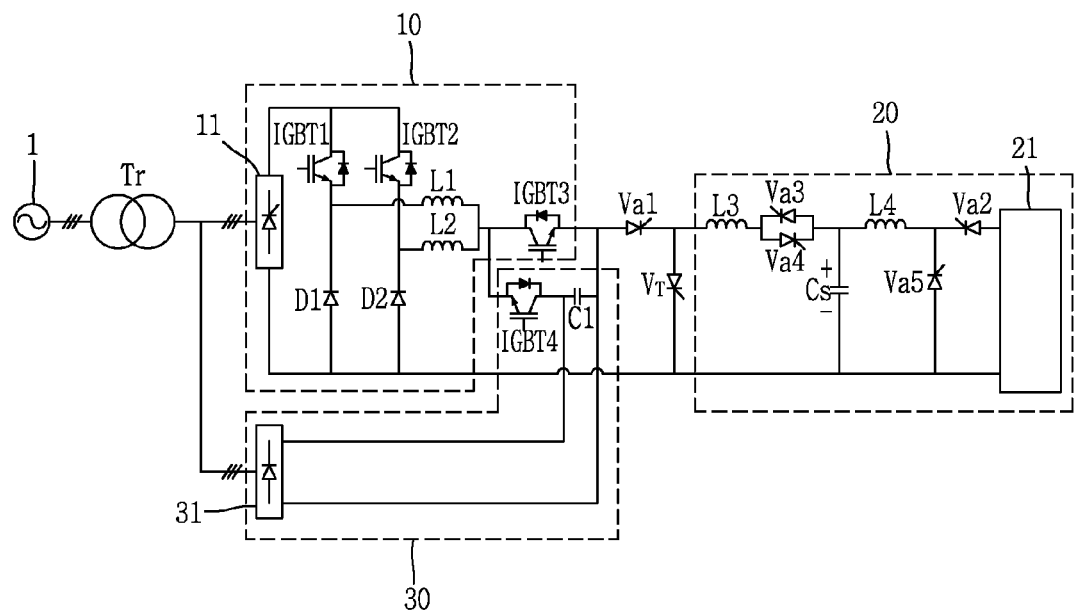
FIG. 1 is a circuit diagram schematically showing a configuration of an apparatus for testing a thyristor valve according to an embodiment of the present disclosure.

Description will now be given in detail of the exemplary embodiments, with reference to the accompanying drawings. For the sake of brief description with reference to the drawings, the same or equivalent components will be provided with the same reference numbers, and description thereof will not be repeated.

It will be understood that when an element is referred to as being "connected with" another element, it can be directly connected with the other element or intervening elements may also be present. In contrast, when an element is referred to as being "directly connected with" another element, there are no intervening elements present.

The terminology used herein is used for the purpose of describing particular embodiments only and is not intended to be limiting of the invention. Also, as used herein, singular forms "a", "an" and "the" are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the disclosure, and are not intended to preclude the possibility that one or more other features, numbers, operations, actions, components, parts, or combinations thereof may exist or may be added. In addition, the terms such as "-er", "-or" and "module" described in the disclosure mean units for processing at least one function and operation and can be implemented by hardware components or software components and combinations thereof.

Embodiments of the present disclosure will be described in detail with reference to the accompanying drawings, the same reference numerals designate the same elements.

FIG. 1 is a circuit diagram schematically showing a configuration of an apparatus for testing a thyristor valve according to an embodiment of the present disclosure; and A rated current and a rated voltage are applied to a thyristor valve actually employed in a high voltage direct current (HVDC) electric power transmission system, according to an ON and OFF operation thereof. Thus, performance of the thyristor valve should be verified by inspecting current stress when the thyristor valve is turned on and voltage stress when the thyristor valve is turned off.

Thus, the apparatus for testing a thyristor valve according to the preferred embodiment of the present disclosure applies a current and a voltage to a thyristor valve with a time difference therebetween, to thereby test both current stress when the thyristor valve is turned on and voltage stress when the thyristor valve is turned off.

In the following description, a thyristor valve as a test target will be referred to as a test valve and designated by a reference numeral VT.

In the drawings, a plurality of switches are implemented as IGBTs (Insulated Gate Bipolar Transistors) but the present disclosure is not limited thereto and the plurality of switches may also be implemented as ON/OFF-controllable elements such as IGCTs (Integrated Gate-Commutated Thyristors), or the like.

Referring to FIG. 1, an apparatus for testing a thyristor valve according to an embodiment of the present disclosure includes a current source circuit 10, a voltage source circuit 20, a first auxiliary valve Va1, and an auxiliary circuit 30.

In FIG. 1, reference numeral 1 designates commercial AC electric power source and reference numeral Tr designates a transformer.

The current source circuit 10 and the voltage source circuit 20 are provided in both sides based on a test valve VT.

When the test valve VT is turned on, the current source circuit 10 supplies the electric current. The current source circuit 10 may include a first DC source circuit section 11 controlling an increase rate(in other words an increase slope) of the current applied to the test valve VT by changing a DC voltage as an output voltage, and a chopper circuit stepping down an output voltage from the first DC source circuit section 11.

The first DC source circuit section 11 may be configured by a phase control rectifier rectifying an AC and outputting a varying DC voltage, and in this case, a 6-pulses phase control rectifier, a 12-pulses phase control rectifier, an 18-pulses phase control rectifier, or the like, may be used.

The chopper circuit, configured by a switch, a diode, an inductor, or the like, may step down an input voltage and output the same. In FIG. 1, a 2-phases chopper circuit is illustrated. The 2-phases chopper circuit includes a first switch IGBT1, a first diode D1, a first inductor L1, a second switch IGBT2, a second diode D2, a second inductor L2, and a third switch IGBT3.

The 2-phases chopper circuit is configured by a first current path and a second current path are connected in parallel between the first DC source circuit section 11 and the third switch IGBT3. The first current path is made up of the first switch IGBT1, the first diode D1, and the first inductor L1 and the second current path is made up of the second switch IGBT2, the second diode D2, and the second inductor L2.

In the first current path, a collector of the first switch IGBT1 is connected to a anode output terminal of the first DC source circuit section 11. Both ends of the first diode D1 are connected to an emitter of the first switch IGBT1 and a cathode output terminal of the first DC source circuit section 11, respectively. The first inductor L1 is provided between a connection point (in other words a node) between the first switch IGBT1 and the first diode D1 and the third switch IGBT3.

In the second current path, a collector of the second switch IGBT2 is connected to the anode output terminal of the first DC source circuit section 11. Both ends of the second diode D2 are connected to an emitter of the second switch IGBT2 and the cathode output terminal of the first DC source circuit section 11. The second inductor L2 is provided between a connection point between the second switch IGBT2 and the second diode D2 and the third switch IGBT3.

Meanwhile, although the 2-phases chopper circuit is illustrated in FIG. 1, but it would be obvious for a person skilled in the art the present disclosure pertains that a single-phase chopper circuit or a multi-phases chopper circuit, i.e., three or more-phases chopper circuit, is applicable.

The voltage source circuit 20 provides a reverse voltage or a forward voltage when the test valve VT is turned off.

The voltage source circuit 20 includes a resonant circuit for inverting polarity of a voltage applied to the test valve VT by turning on or off an auxiliary valve, and a second auxiliary valve Va2 for connecting the low-current high-voltage source 21 to the resonant circuit.

The resonant circuit includes two inductors L3 and L4, three auxiliary valves Va3, Va4, and Va5, and a capacitor for resonance Cs.

In the voltage source circuit 20, one end of the third inductor L3 is connected to an anode of the test valve VT, and the other end thereof is connected to a connection point between a cathode of the third auxiliary valve Va3 and an anode of the fourth auxiliary valve Va4 which are connected in parallel. The capacitor for resonance Cs is connected in parallel to a connection point between an anode of the third auxiliary valve Va3 and a cathode of the fourth auxiliary valve Va4 which are connected in parallel, and one end of the fourth inductor L4 is connected to the connection point between an anode of the third auxiliary valve Va3 and a cathode of the fourth auxiliary valve Va4.

The fifth auxiliary valve Va5 is connected to a connection point between the other end of the fourth inductor L4 and a cathode of the second auxiliary valve Va2, and an anode of the second auxiliary valve Va2 is connected to the low-current high-voltage source 21.

The first auxiliary valve is provided between a connection point between the voltage source circuit 20 and the test valve VT and the current source circuit 10. In detail, an anode of the first auxiliary valve Va1 is connected to an emitter of the third switch IGBT3, and a cathode of the first auxiliary valve Va1 is connected to a connection point between the third inductor L3 and the test valve VT.

The first auxiliary valve Va1 is a component for electrically insulating the current source circuit 10 from the voltage source circuit 20 and is an element used to restrain a high voltage to protect the current source circuit 10 from a high voltage of the voltage source circuit 20.

In a case in which the test valve VT is turned on, the first auxiliary valve Va1 is turned on to allow a current from the current source circuit 10 to flow to the test valve VT.

Also, in a case in which the test valve VT is turned off, since a voltage should be applied from the voltage source circuit 20 to the test valve VT, the first auxiliary valve Va1 is turned off to thus protect the current source circuit 10 from a high voltage of the voltage source circuit 20.

The auxiliary circuit 30 serves to forcibly turn off the first auxiliary valve Va1. When the test valve VT is turned off, the auxiliary circuit 30 forcibly turns off the first auxiliary valve Va1. The auxiliary circuit 30 includes a second DC source circuit section 31, an auxiliary switch IGBT4, and a first capacitor C1.

The second DC source circuit section 31 serves to provide a constant DC voltage to turn off the first auxiliary valve Va1. The second DC source circuit section 31 may be configured by a 6-pulses diode rectifier, a 12-pulses diode rectifier, a 18-pulses diode rectifier, or the like.

In the auxiliary circuit 30, an emitter of the auxiliary switch IGBT4 is connected to a collector of the third switch IGBT3, a collector of the auxiliary switch IGBT4 is connected to one end of the first capacitor C1, and the other end of the first capacitor C1 is connected to an emitter of the third switch IGBT3. Namely, the auxiliary switch IGBT4 and the first capacitor C1, which are connected in series, are connected to the third switch IGBT3 in parallel. Also, a connection point between the auxiliary switch IGBT4 and the first capacitor C1 is connected to a anode output terminal of the second DC source circuit section 31, and a connection point between the third switch IGBT3 and the first capacitor C1 is connected to a cathode output terminal of the second DC source circuit section 31.

Hereinafter, an operational process of testing a thyristor valve by using the apparatus for testing a thyristor valve according to an embodiment of the present disclosure configured by described above will be described in detail with reference to FIGS. 2A to 2I.

FIGS. 2A to 2I are circuit diagrams illustrating an equivalent circuit according to each operation mode in the apparatus for testing a thyristor valve according to an embodiment of the present disclosure.

An operation mode of the apparatus for testing a thyristor valve according to an embodiment of the present disclosure may be determined according to a combination of switching states of a plurality of switches.

FIGS. 2A to 2D are views illustrating an equivalent circuit according to each operation mode in case that a current is applied to a test valve VT when the test valve VT is in an ON state.

Figure 2A:
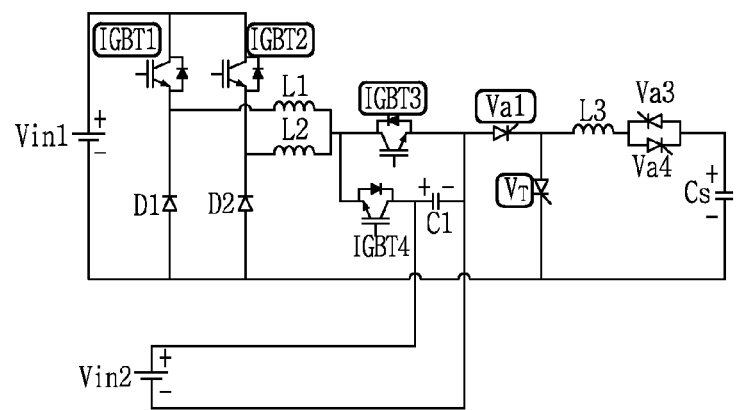
Figure 2B:
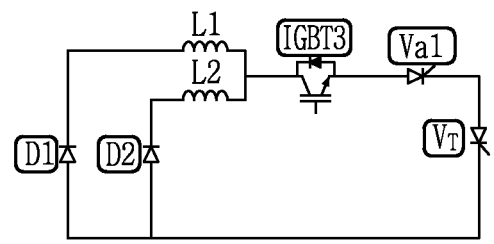
Figure 2C:
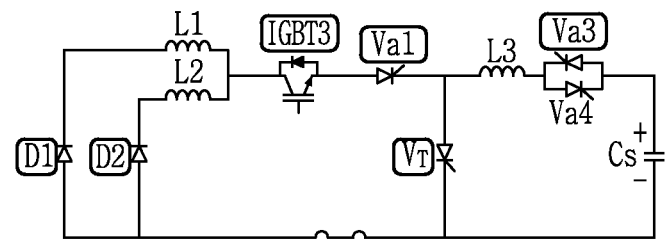
Figure 2D:
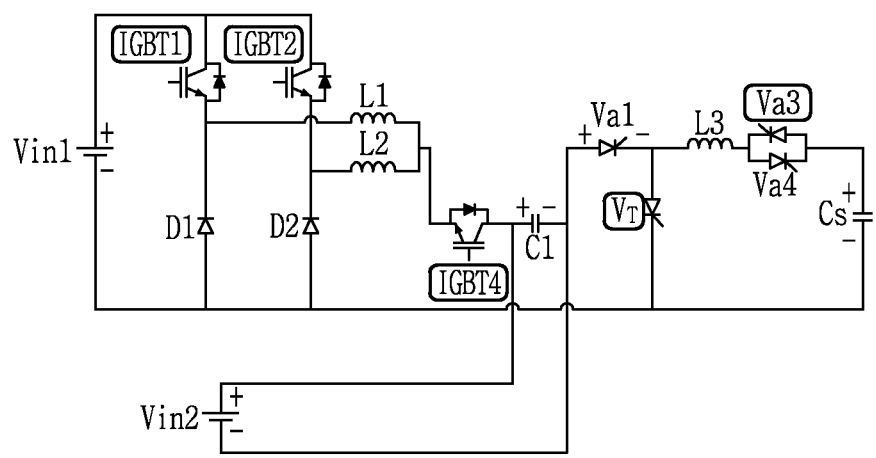
Figure 2E:
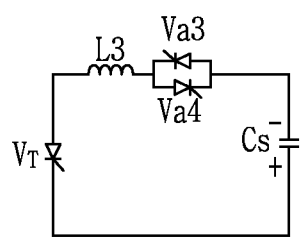
Figure 2F:
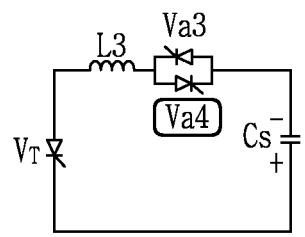
Figure 2G:
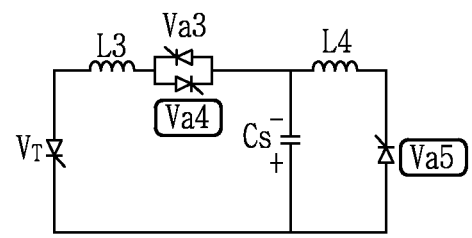

FIGS. 2E to 2G are views illustrating an equivalent circuit according to each operation mode in case that a reverse voltage is applied to the test valve VT when the test valve VT is in an OFF state.

Figure 2H:
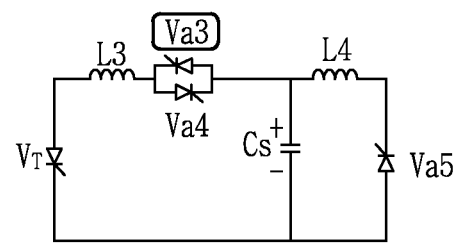
Figure 2I:
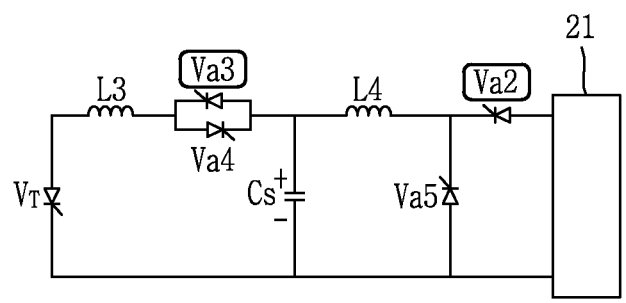

FIGS. 2H to 2I are views illustrating an equivalent circuit according to each operation mode in case that a forward voltage is applied to the test valve VT when the test valve VT is in an OFF state.

In the drawings, the first DC source circuit section 11 and the second DC source circuit section 31 are illustrated as being equivalent to a first DC voltage source Vin1 and a second DC voltage source Vin2. In the equivalent circuit diagram according to each operation mode, reference letters corresponding to elements in an ON state are designated to be contoured thick, so as to be easily recognized.

In FIG. 2A, when the test valve VT, the first switch IGBT1, the second switch IGBT2, the third switch IGBT3, and the first auxiliary valve Va1 are turned on by supplying a gate control signal through a controller (not shown), a current flowing through the test valve VT is increased with a predetermined slope. In this case, the capacitor for resonance Cs and the first capacitor C1 are in a state of being charged with an initial voltage having polarities as illustrated, respectively.

In this case, referring to FIG. 2A, a current path from the first switch IGBT1 (or the second switch IGBT2) to the test valve by way of the first inductor L1 (or the second inductor L2), the third switch IGBT3, and the first auxiliary switch valve Va1 is formed. When the current flowing through the test valve VT is increased to a predetermined reference value, in order to maintain the current value equivalent to the reference value flowing through the test valve VT, a PWM (Pulse Width Modulation) signal is provided to the first switch IGBT1 and the second switch IGBT2 for a predetermined period of time to PWM-switch the first switch IGBT1 and the second switch IGBT2.

When the PWM switching is terminated, the first and second switches IGBT1 and IGBT2 are turned off. Then, the amount of current flowing through the first and second diodes D1 and D2 is gradually reduced, and FIG. 2B illustrates an equivalent circuit in such an operational state. In the operation mode shown on FIG. 2B, a current path from the first diode D1 (or the second diode D2) to the test valve VT by way of the first inductor L1 (or the second inductor L20, the third switch IGBT3, and the first auxiliary valve Va1 is formed.

In FIG. 2B, the current flowing in the test valve VT is supplied from energy stored in the first and second inductors L1 and L2 (hereinafter, referred to as a supply current), and the amount of current is gradually reduced to reach 0, resultantly turning off the test valve VT.

In order for the current flowing through the test valve VT having a predetermined slope to be reduced until when the test valve VT is turned off, the third auxiliary valve Va3 is turned on by a gate control signal from a controller (not shown) before the supply current from the first and second inductors L1 and L2 becomes 0, to allow a resonance current to be supplied together with the supply current to the test valve VT. FIG. 2C illustrates an equivalent circuit in such an operation mode (in other words operational state).

Referring to FIG. 2C, a path of the supply current is formed starting from the first diode D1 (or the second diode D2) to the test valve VT by way of the first inductor L1 (or the second inductor L20), the third switch IGBT3, and the first auxiliary valve Va1, and a path of the resonance current is formed starting from the capacitor for resonance Cs to the test valve VT by way of the third auxiliary valve Va3 and the third inductor L3. Thus, the supply current and the resonance current are summed to flow through the test valve VT.

When the supply current becomes 0, in order to turn off the first auxiliary valve va1 before testing voltage stress with respect to the test valve VT, a gate control signal is applied from the controller (not shown) to turn on the auxiliary switch IGBT4 and a DC voltage from the second DC source circuit section 31 is applied to the first capacitor C1.

Then, a reverse voltage equal to a difference between the voltage of the second current voltage source Vin2 and the voltage of the first DC voltage source Vin1 is applied to the first auxiliary valve Va1, turning off the first auxiliary valve Va1.

FIG. 2D illustrates an equivalent circuit in such an operation mode. In the equivalent circuit of FIG. 2D, the resonance current flows from the capacitor for resonance Cs to the test valve VT through the third auxiliary valve Va3 and the third inductor L3.

Thereafter, when the resonance current also becomes 0, as illustrated in FIG. 2E, the test valve VT and the third auxiliary valve Va3 are turned off by the gate control signal from the controller (not shown), and at this time, polarity of the voltage of the capacitor for resonance Cs is inverted.

Thereafter, as illustrated in FIG. 2F, when the fourth auxiliary valve Va4 is turned on by the gate control signal from the controller (not shown), a reverse voltage is applied to the test valve VT.

Thereafter, as illustrated in FIG. 2G, when the fifth auxiliary valve Va5 is turned on by supplying the gate control signal from the controller, the capacitor for resonance Cs, the fifth auxiliary valve Va5, and the fourth inductor L4 form a resonance circuit.

When a predetermined period of time has elapsed, as illustrated in FIG. 2H, the polarity of the voltage of the capacitor for resonance Cs is inverted again, and at this time, the gate control signal from the controller (not shown) is supplied to turn off the fourth and fifth auxiliary valves Va4 and Va5 and turn on the third auxiliary valve Va3. Then, a forward voltage from the capacitor for resonance Cs is applied to the test valve VT.

Meanwhile, a circuit for supplementing the forward voltage across the capacitor for resonance Cs may be connected. FIG. 2I illustrates an operation mode for supplementing the forward voltage at both ends of the capacitor for resonance Cs.

As illustrated in FIG. 2I, when the second auxiliary valve Va2 is turned on by supplying the gate control signal from the controller (not shown), the capacitor for resonance Cs can be charged by a current from the low-current high-voltage source 21, whereby the forward voltage applied to the test valve VT can be supplemented. When the capacitor for resonance Cs is fully charged, the supply of the gate control signal from the controller (not shown) is stopped, turning off the second auxiliary valve Va2.

In this manner, the apparatus for testing a thyristsor valve according to an embodiment of the present disclosure can test both current stress and voltage stress when the test valve is turned on and off by selectively applying current, the reverse voltage and the forward voltage to the test valve by means of the overall single circuit constituting the testing apparatus.

In the case of the apparatus for testing a thyristor valve, since both current stress and voltage stress when the thyristor valve is turned on and off can be tested by selectively applying current, the reverse voltage and forward voltage when the thyristor valve is turned on or off through the single circuit, the configuration and operation of the testing apparatus are simple and economical efficiency and ease of operation can be enhanced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus for testing a thyristor valve, the apparatus comprising:
    a current source circuit that provides an electric current when a thyristor valve as a test target is turned on;
    a voltage source circuit that provides a reverse voltage or a forward voltage when the thyristor valve is turned off;
    a first auxiliary valve provided between a connection point between the thyristor valve and the voltage source circuit and the current source circuit, and that insulates the current source circuit from the voltage source circuit to protect the current source circuit from a high voltage of the voltage source circuit; and
    an auxiliary circuit that forcibly turns off the first auxiliary valve when the thyristor valve is turned off,
    wherein the auxiliary circuit comprises:
    a first direct current (DC) source circuit section that generates a DC voltage for turning off the first auxiliary valve;
    an auxiliary switch having one end connected to an anode output terminal of the first DC source circuit section and the other end connected to the current source circuit; and a capacitor having one end connected to the auxiliary switch and the other end connected to a connection point between the current source circuit and the first auxiliary valve.

2. The apparatus of claim 1, wherein the current source circuit comprises:
   a second DC source circuit section that changes a DC voltage and supply the DC voltage while controlling an increase rate of a current provided to the thyristor valve; and
   a chopper circuit that steps down an output voltage from the second DC source circuit section.

3. The apparatus of claim 2, wherein the second DC source circuit section is configured by any one of a 6-pulses phase control rectifier, a 12-pulses phase control rectifier, and a 18-pulses phase control rectifier.

4. The apparatus of claim 2, wherein the chopper circuit comprises:
   a first switch having one end connected to an anode output terminal of the second DC source circuit section;
   a first diode provided between the first switch and a cathode output terminal of the second DC source circuit section;
   a first inductor connected to a connection point between the first switch and the first diode; and
   a second switch provided between the first inductor and the first auxiliary valve.

5. The apparatus of claim 2, wherein the chopper circuit is configured by a single-phase chopper circuit, or a multi-phases chopper circuit.

6. The apparatus of claim 5, wherein the first switch and the second switch are configured by any one of an IGBT (Insulated Gate Bipolar Transistor) and an IGCT (Integrated Gate-Commutated Thyristor), respectively.

7. The apparatus of claim 1, wherein the second DC source circuit section is configured by any one of a 6-pulses diode rectifier, a 12-pulses diode rectifier, and a 18-pulses diode rectifier that converts an AC voltage into a DC voltage.

8. The apparatus of claim 1, wherein the auxiliary switch is an IGBT (Insulated Gate Bipolar Transistor) or an IGCT (Integrated Gate-Commutated Thyristor).

* * * * *